United States Patent [19]

Thomas et al.

[11] Patent Number: 4,728,353
[45] Date of Patent: Mar. 1, 1988

[54] PROCESS AND APPARATUS FOR PYROLYTICALLY COATING GLASS

[75] Inventors: Jean-François Thomas, Ottignies; Robert Terneu, Thiméon; Albert Van Cauter, Charleroi; Robert Van Laethem, Loverval-Gerpinnes, all of Belgium

[73] Assignee: Glaverbel, Brussels, Belgium

[21] Appl. No.: 930,755

[22] Filed: Nov. 14, 1986

[30] Foreign Application Priority Data

Dec. 20, 1985 [GB] United Kingdom ............... 8531425

[51] Int. Cl.$^4$ .................... C03C 17/00; B05B 15/12
[52] U.S. Cl. ................... 65/60.1; 65/60.51; 65/60.52; 65/181; 118/50.1; 118/326; 118/718; 427/109; 427/166; 427/226
[58] Field of Search .............. 65/60.1, 60.3, 60.52, 65/90, 60.51, 181, 193; 427/109, 166, 226; 118/50.1, 326, 718

[56] References Cited

U.S. PATENT DOCUMENTS 4,293,326 10/1981 Terneu et al. ............... 427/166 X
4,414,015 11/1983 Laethem et al. ............... 65/60.3
4,536,204 8/1985 Laethem et al. ............... 65/60.52

*Primary Examiner*—Arthur Kellogg

*Attorney, Agent, or Firm*—Spencer & Frank

[57] ABSTRACT

Apparatus for pyrolytically forming a metal compound coating on an upper face of a hot glass substrate 1 in sheet or ribbon form comprises conveyor means 2 for conveying a the substrate along a path also indicated at 1 in a downstream direction 3, a roof structure 5 defining a coating chamber 6 opening downwardly onto the path 1 and means 7 for discharging coating precursor material into the chamber 6. Upstream of the coating chamber 6 there is an antechamber 25 which communicates with the coating chamber 6 via an entry slot 24 which is defined in part by the path of the substrate 1, and via which gas can be caused to flow into the coating chamber 6 so as to form (when the apparatus is in use) a blanket layer which covers the upper face of the substrate 1 along a first part of the length of the chamber 6. Means 26 is provided for controllably preheating the gas forming the blanket layer.

In operation, the gaseous environment in the immediate vicinity of the upper face of the substrate at least in the zone at which coating formation commences, is controlled by feeding preheated gas in a downstream direction into the chamber 6 to enter the chamber in contact with the substrate and form a blanket layer which covers the substrate at least as far as that zone.

38 Claims, 4 Drawing Figures

PROCESS AND APPARATUS FOR PYROLYTICALLY COATING GLASS

This invention relates to a pyrolytic coating process in which a hot glass substrate in sheet or ribbon form travels in a downstream direction beneath a coating chamber which opens downwardly towards the substrate and in which a coating is formed on the upper face of said substrate from coating precursor material. The invention also relates to apparatus for pyroltically forming a metal compound coating on an upper face of a hot glass substrate in sheet or ribbon form comprising conveyor means for conveying a said substrate along a path in a downstream directon, a roof structure defining a coating chamber opening downwardly onto said path and means for discharging coating precursor material into said chamber.

Such processes and apparatus are useful in the manufacture of coated glass for various purposes, the coating being selected to confer some particular desired property on the glass. Especially important examples of coatings which may be applied to glass are those designed to reduce the emissivity of the coated face in respect of infra-red radiation, especially infra-red radiation having wavelengths in excess of 3 $\mu$m, and those designed to reduce the total energy transmissivity of the coated glass in respect of solar radiation. It is known, for example, to provide glass with a low infra-red emissivity coating of tin dioxide for heat conservation purposes, and it is also known to provide glass with a solar energy transmissivity reducing coating of a metal oxide such as titanium dioxide or of a mixture of metal oxides such as $Fe_2O_3+CoO+Cr_2O_3$ with the principal object of reducing solar heat gain or glare.

It will be apparent that coatings which are applied to glass to be used for glazing purposes should have a high and uniform optical quality, and that they should be durable. It will also be apparent that the coating formed should be of the correct thickness for the purpose in view, and that it is commercially desirable that the rate of formation of coating material should be sufficient to build up the coating thickness desired even when the substrate is moving at a rather rapid speed as may be dictated for example by other processes in the manufacturing schedule.

Various factors relating to the coating process have been found to influence the way in which the coating is formed on the substrate, and among these may be cited the physical phase of the material from which the coating is formed and the nature of that material, the energy with which that material is caused to contact the substrate, and the temperature of the coating chamber and of the substrate being coated.

It is for example known that the rate at which coating reactions take place is temperature dependent. In general, the higher the temperature, the more rapidly is a coating build up, and the finer is the crystal structure of the coating formed. A uniformly fine crystal structure is beneficial for high coating quality and for durability.

Accordingly, prior art processes have sought to control the temperature of the hot substrate prior to coating formation, and steps have also been taken to control the temperature of the whole environment within the coating chamber.

The present invention is based upon our discovery that the coating quality is strongly influenced by a factor which has hithereto been overlooked, namely the temperature of the atmosphere immediately above the substrate in the zone where coating formation commences.

According to the present invention, there is provided a pyrolytic coating process in which a hot glass substrate in sheet or ribbon form travels in a downstream direction beneath a coating chamber which opens downwardly towards the substrate and in which a coating is formed on the upper face of said substrate from coating precursor material, characterised in that the gaseous environment in the immediate vicinity of the upper face of the substrate at least in the zone at which such coating formation commences, is controlled by feeding preheated gas in a downstream direction into said chamber to enter the chamber in contact with the substrate and form a blanket layer which covers the substrate at least as far as the zone.

The possibility of control of the gaseous environment in contact with the substrate at the zone where coating formation commences is a factor which has hitherto been overlooked. We have found that it is much easier to control conditions in such a blanket layer with the degree of precision required than it is to control the whole environment within the coating chamber, and that it is thereby possible to create a general flow of gas in contact with the substrate from upstream of the zone where coating formation commences in such a way that at that zone there is a micro-climate in contact with the substrate face which is hospitable to the coating reactions which are to take place. In order to do this, it is necessary to control or modify the atmospheric layer which would ordinarily be entrained into the coating chamber in contact with the substrate by supplying preheated gas, so as to make the layer covering the glass favourably conditioned for the coating reactions. This is in particular distinction to certain prior art techniques in which the naturally entrained gas layer is disturbed by directing strong currents of relatively cool gas onto the substrate at the upstream end of the coating chamber. Furthermore, because it is relatively easy to control conditions within the said blanket layer, it is relatively easy to adjust those conditions, for example to compensate for minor variations in the thickness of the coating being deposited during a continuous production run.

Embodiments of the invention in which there is a general downstream flow of coating precursor material above the blanket layer within the coating chamber are especially beneficial for the formation of high quality coatings because of the control which is thus exercised over the flow of reactants within the atmosphere of the coating chamber.

Preferably, a general downstream flow of gas along the coating chamber is at least in part maintained by aspirating atmospheric material from that chamber at its downstream end. To the extent to which that downstream flow is maintained by aspirating forces generated in downstream end exhaust ducting, the forces acting on the gas at the upstream end of the coating chamber, and the forces exerted by the flow of gas at the upstream end of that chamber, will be more diffuse. It has been found that this promotes an initial formation of a coating substratum which is of a fine and uniform crystal structure at the upstream end of the coating chamber. The coating crystal structure at the glass/coating interface has a stong influence on the way in which the remainder of the coating thickness builds up as the substrate travels along the coating chamber, and is of major importance in the formation of high quality coatings.

A process according to this invention gives the greatest benefits when it is performed within a substantially enclosed coating chamber so avoiding disruption of the blanket layer by random currents. In fact the most likely source of such random currents will be the downstream end of the coating chamber. Accordingly, in especially preferred embodiments of the invention, the coating chamber is substantially closed at its downstream end to prevent interchange of atmospheric material between the downsteam end of the coating chamber and a further downstream region of the substrate path. Such closure may for example be effected by exhaust ducting extended across the full width of the coating chamber at its downstream end. The adoption of this feature also has the advantage of avoiding any dilution or pollution of the atmosphere in the downstream end of the coating chamber from the further downstream region, and it prevents currents of the coating chamber atmosphere from interfering with any further processing of the substrate and from depositing any additional undesired material onto the coating downstream of the coating chamber.

In particularly advantageous embodiments of the invention, the glass substrate is a freshly formed ribbon of hot glass and the coating is formed after that ribbon leaves a ribbon-forming plant, and before its entrance to an annealing lehr. The coating chamber may thus be located at a position where the glass is anyway at a temperature appropriate for the pyrolytic coating reactions to take place, so that costs involved in reheating the glass to such a temperature are avoided or substantially reduced. It is also important that the coating should take place within a chamber which is physically distinct from the ribbon-forming plant on the one hand and the annealing lehr on the other hand. If there is no such distinction, and it is common in previously known proposals in this field for the coating to take place within the length of the annealing lehr, then atmospheric conditions within the coating chamber would be apt to be disturbed by currents of gas flowing from the annealing lehr and from the ribbon forming plate—such currents often entrain dust and other pollutants which might become incorporated in the coating as defects—and also, there would be a risk that the pattern of atmospheric currents in the lehr would be disturbed so leading to less favourable annealing conditions.

Depending on pressure conditions above and below the substrate at the coating chamber there may be a tendency for the atmosphere from beneath the substrate to flow upwards past its sides, where it would dilute the precursor-laden atmosphere above the substrate. This can lead to the formation of coating deposits which are thinner over the substrate margins than they are over the central portion of the substrate, with the result that a certain proportion of the width of the coated substrate is of unacceptable quality. Alternatively there may be a tendency for the precursor-laden atmosphere to flow beneath the substrate where it would be likely to deposit an undesired coating on its under surface. Depending on the flow pattern of atmospheric currents in and below the coating chamber, this undesired coating might be more or less regular, but so thin as to give rise to highly objectionable interference effects, for example it may be a more or less regular coating whose thickness decreases towards the centre of the substrate, or it might be a rather irregular coating of a pattern thought by some to be reminiscent of the markings on a backgammon board. In order to reduce these disadvantages, especially preferred embodiments of the invention provide that over at least part of the length of the chamber, flow of atmospheric material past the side edges of the substrate and between zones vertically above and vertically below that substrate is inhibited. We have found that by acting in this way, the usefully coated width can be increased, and this is particularly valuable when coating a freshly formed continuous ribbon of glass.

We have found that the way in which the coating precursor material is introduced into the coating chamber is not critical for coating quality, for example it may be introduced in the vapour phase.

Preferably however, the coating precursor material is sprayed downwardly and in the downstream direction. This facilitates the discharge of the coating precursor material while affording relatively little disturbance to the blanket layer because evaporated material will already have some momentum in the downstream direction. It also lengthens the trajectory of the sprayed material as compared with vertical spraying from the same height so allowing more time for the sprayed coating precursor material to be conditioned in the coating chamber before contact with the substrate.

It is preferred that the coating precursor material is sprayed downwardly into the coating chamber and through said blanket layer, since this greatly facilitates handling of the large quantities of coating precursor material required for forming thick coatings, especially on rapidly moving substrates. The invention can thus be adapted to the formation of coatings of rather high thicknesses, for example thicknesses of 500 nm or more.

It is known that there are certain disadvantages associated with prior art liquid phase coating techniques. In such prior art techniques it is very difficult to avoid staining of the coating formed due to splashing of the sprayed droplets when they impact against the substrate. Also when conventional liquid phase coating techniques are used, contact between the usually rather large quantities of coating solution sprayed and the hot substrate can give rise to considerable difficulties, especially when the coating is deposited on a freshly formed ribbon of hot glass, because it interferes with a subsequent annealing treatment. The result of this is that the glass is badly annealed, and in some cases residual stresses locked in the glass ribbon after cooling make it difficult to cut, and may even be such as to cause it to break when it is cut into sheets.

In order to reduce or eliminate these problems, certain especially advantageous embodiments of this invention provide that a spraying zone of said coating chamber is heated to cause evaporation of part of the coating precursor material before it reaches the substrate to charge the atmoshphere in such zone with vaporised coating precursor solution; the solution is sprayed with sufficient energy to ensure positive impact of residual sprayed coating precursor material against the substrate to initiate coating of said substrate face; and atmosphere laden with coating precursor material in the vapour phase is caused to flow in the downstream direction from said spraying zone along and in contact with the coated substrate face for a contact time of at least 10 seconds, whereafter residual material of said precursor laden current is directed away from the substrate.

When adopting this feature, it is possible, for a given rate of precursor discharge, to reduce the strength of the currents which will impinge against the glass at the zone where coating formation commences. This is particularly valuable in reducing disturbance to the blanket layer of atmosphere in contact with the substrate, and can lead to the formation of a coating of very high quality. It is found that a relatively small quantity of the discharged material can penetrate the blanket layer for positive impact against the glass so that the blanket layer can remain largely undisturbed.

Such a process is useful for the formation of coatings exhibiting low and uniformly low haze. This is particularly surprising since it has hitherto been thought necessary to remove coating precursor and reaction product vapours from the substrate as rapidly as possible—contact times of between 2 and 5 seconds are usual in previously known processes—precisely in order to reduce the risk of spurious depositions from those vapours which would lead to an increase in haze.

The reasons why the use of such a process should favour better coating quality standards are not wholly clear. One possible explanation is that a substantial proportion of the thickness of the coating is built up from precursor material in the vapour phase as the substrate travels through the passageway portion of the coating chamber. Vapour phase coating techniques are known to favour a fine and uniform crystal structure in the coating. But this does not explain why the performance of such embodiments of this invention should result in the formation of a coating which has a far more regular thickness than can be obtained by the use of conventional vapour phase coating processes. Another possible explanation is that although only a small proportion of the coating thickness is formed from precursor material in the vapour phase, there is a conditioning of the newly formed main body of the coating during the said contact time of at least 10 seconds in which the substrate is exposed to coating precursor vapour so that the crystal structure of the coating can be modified in a way that is favourable for coating quality, and in particular that exposure of the freshly formed coating to precursor vapour enables any small pores in the coating to be filled thus giving rise to a harder and more compact and weather-resisant coating.

For example, the present invention may with advantage be combined with the invention described in a copending British Patent Application filed on this date (Dec. 20, 1985, Application Number 85 31 423), which application describes and claims a process of pyrolytically forming a metal compound coating on an upper face of a hot glass substrate in sheet or ribbon form during its conveyance in a downstream direction along a path through a coating chamber in which at least one stream of coating precursor solution is sprayed downwardly towards the substrate, characterised in that: a spraying zone of said coating chamber is heated to cause evaporation of part of the coating precursor material before it reaches the substrate to charge the atmosphere in such zone with vaporised coating precursor material; the solution is sprayed with sufficient energy to ensure positive impact of residual sprayed coating precursor material against the substrate to initiate coating of said substrate face; and atmosphere laden with coating precursor material in the vapour phase is caused to flow in the downstream direction from said spraying zone along and in contact with the coated substrate face for a contact time of at least 10 seconds, whereafter residual material of said precursor-laden current is directed away from the substrate.

In certain other especially preferred embodiments of the invention, for forming a metal oxide coating, coating precursor material and oxidising gas are continuously fed into a mixing zone in which said precursor material and oxidising gas are brought together out of contact with the substrate and in which they are subjected to mixing forces so as to create an atmosphere comprising an intimate mixture of precursor vapour and oxidising gas, and a stream of such mixture is caused to flow continuously from said mixing zone into and along a passageway to which said substrate face is exposed.

Again, this reduces disturbance of the blanket layer by the discharged coating precursor material. It is in fact rather surprising that the blanket layer of gas over the substrate does not act as a shield preventing such vapour laden atmosphere from forming a coating on the glass. But a very high quality coating can be formed in this way, presumably because the coating precursor vapours can mix into the blanket layer substantially without disturbing its general flow.

It is particularly surprising that such mixing does not involve the premature formation of coating reaction products which would feed along the passageway above the substrate and fall as spurious deposits forming defects on or in the coating. It is also surprising that forming an intimate mixture of the coating precursor and an oxidising atmosphere within the mixing zone and then causing that mixture to flow along the passageway in contact with the substrate is sufficient to achieve a coating which is substantially free from unpredicatable variations in its thickness, and that the precise way in which the coating precursor material is introduced into the coating chamber is not critical for achieving such thickness regularity. It is also worth remarking that contrary to what might be expected, such mixing does in fact leave sufficient unreacted coating precursor material available for the formation of a coating on the substrate as that material flows in the vapour phase downstream along the passageway. This is quite inconsistent with the teaching of the prior art in this field.

Be that as it may, we have found that such especially preferred embodiments of the present invention facilitate the formation of coatings of high and uniform quality and enable such coatings to be formed to a more regular thickness than has hitherto been possible.

Such embodiments of the invention also afford particular benefits in the formation of relatively thick coatings, for example those above 400 nm in thickness. We have found that rapid removal of the vapour-laden atmosphere is not a requirement for a substantially defect-free coating, so more time can be allowed for the coating to build up to a desired thickness.

For example, the present invention may with advantage be combined with the invention described in our copending British Patent Application filed on this date (Dec. 20, 1985, Application No. 85 31 424), which application describes and claims a process of pyrolytically forming a metal oxide coating on an upper face of a hot glass substrate in sheet or ribbon form during its conveyance in a downstream direction along a path leeading beneath a downwardly opening coating chamber, in which process said coating is formed from coating precursor vapour and an oxidising gas which are fed in the downstream direction along a passageway of said coating chamber to which said substrate face is exposed, characterised in that coating precursor material and oxidising gas are continuously fed into a mixing zone in which said precursor material and oxidising gas are brought together out of contact with the substrate and in which they are subjected to mixing forces so as to create an atmosphere comprising an intimate mixture of precursor vapour and oxidising gas, and a stream of such mixture is caused to flow continuously from said mixing zone into and along said passageway in contact with the upper substrate face.

Preferably, the gas forming said blanket layer has been preheated to a greater extent than it could be by heat transfer from the substrate alone. It has been found particularly beneficial for a high and uniform coating quality that the temperature of the gases within the blanket layer should be high in order to create the best possible conditions for initial coating formation. This also promotes a rapid coating build up rate.

One of the problems upon which much research has been brought to bear is that of variations in coating thickness across the width of the substrate being coated. As a particular instance of this problem, it has been found when coating a hot freshly formed ribbon of flat glass that the margins of the ribbon are coated to a lesser thickness than a central ribbon strip. Accordingly those marginal portions do not meet the desired quality standards and are treated as waste. We have already referred to dilution of the coating precursor material at the sides of the coating chamber as being one possible cause of this phenomenon. Recent reserach has led to the conclusion that this is also due to temperature inequalities across the width of the substrate being coated. It is known for example that material within the coating chamber will tend to cool more, the closer it is to the side walls of that chamber.

In especially preferred embodiments of the invention, the gas forming side marginal portions of said blanket layer has been preheated to a greater extent than it is at the centre. As has been stated, there is naturally a heat loss through the side wall of the coating chamber and of any passage leading to that chamber, and the adoption of this feature sets up a thermal barrier which enables that heat loss to be compensated for. As a particular example of the advantages which can be achieved by the adoption of this preferred feature of the present invention, we have noted that when coating a freshly formed ribbon of hot glass, even if the glass enters the coating chamber with a substantially uniform temperature profile across its width, in the absence of specific control of the atmosphere in contact with the ribbon at the zone where coating formation commences, as much as one sixth of the ribbon width at each side margin may be of unacceptable quality, and so one third of the total ribbon width is useful only as cullet. By adopting this feature, we have found that the usefully coated width can be increased, and under optimum operating conditions, the useful product yield is limited not so much by the quality of the coating at the ribbon margins, as by the quality of the glass itself at those margins. It will be borne in mind that due to various factors, a few centimetres at each margin of the ribbon of glass are of irregular and unacceptable optical quality and must in any event be discarded or used as cullet.

Advantageously, at least over the side margins of the substrate, the gas in said blanket layer is heated to a temperature greater than that of underlying marginal portions of the substrate. The adoption of this feature results in the formation of a coating of improved optical quality and durability and better thickness uniformity, at least at the margins of the substrate, and promotes compensation for heat loss through such side walls.

Preferably, the gas for forming said blanket layer enters the upstream end of the coating chamber from an adjustment antechamber. This is a very simple way of ensuring the creation of a said blanket layer of gas covering the substrate and which can then be entrained by the substrate to travel in contact therewith at least as far as the zone at which coating formation commences. The upstream end of said antechamber is preferably substantially closed so as to inhibit the flow of gas into that antechamber from upstream, for example from a ribbon-forming plant, and so as to create a buffer zone from which gas can be fed to maintain the said blanket layer.

Advantageously, the gas preheating is effected at least in part in said antechamber and from above the level of the substrate. This facilitates direct control of the temperature of the gas entering the coating chamber from that antechamber.

Gas within the antechamber may be heated there in any convenient manner, but preferably, gas preheating in said antechamber is effected by burners, since this is found most efficient, and it allows an easy and accurate control of the heating, with a rapid response to any adjustment of heater controls.

Preferably, preheated gas is blown upwardly into the sides of said antechamber from below the level of the substrate. This promotes compensation for side heat losses at the level of the substrate, while having a favourable effect on the atmospheric conditions subsisting in the antechamber above the substrate, in particular because it tends to prevent cold air from entering through the side walls of the antechamber.

Alternatively, or in addition, in some especially preferred embodiments of the invention, preheated gas is blown into said antechamber in the downstream direction from above the level of the substrate. This is found to promote a downstream flow of gas into and through the coating chamber, and it is especialy advantageous in embodiments of the invention in which the antechamber is not closed at its upstream end.

Alternatively, or in addition, it is advantageous that preheated gas be blown downwardly into said antechamber and such gas be restrained from flowing down past the side edges of the substrate. This is another convenient way of introducing preheated gas into the antechamber to control atmospheric conditions above the substrate.

We have already referred to the desirability of exercising control over the temperature of the gas blanket particularly in order to compensate for heat losses through the side wall of the coating chamber. As an alternative, or additional, way of effecting such compensation, some preferred embodiments of the invention provide that the volume flow rate of gas forming said blanket layer is controlled differentially across the width of the substrate.

Advantageously, over a substantial part of the height of the chamber, atmospheric material is maintained in a general downstream flow in part by projecting a stream of gas into the chamber in the downstream direction. The adoption of this feature is especially beneficial in promoting a general downstream flow of atmospheric material within the coating chamber, while maintaining the atmospheric pressure within the chamber at a level such that there is little or no tendency for external atmospheric material to be sucked into the chamber through any gaps in its walls, for example due to aspiration at its downstream end.

Preferably, at least one auxiliary stream of preheated gas is introduced into the coating chamber to flow in the downstream direction in or adjacent said blanket layer, and through the zone at which said coating formation commences. Such an auxiliary gas stream has the advantage of increasing the downstream flow momentum of the blanket layer, and/or of protecting it against random currents within the chamber. Also, the use of such a current allows relatively fine control of the temperature and/or flow rate of the blanket layer as a whole, A particularly important use for a process according to the invention is in the formation of tin oxide coatings using stannous chloride as the coating precursor material. Tin oxide coatings, which reduce the emissivity in respect of long wavelength infra-red radiation of the surface of glass sheets to which they are applied, are widely used for reducing heat tranfer from glazed structures. This of course is only an example of the purpose for which the process can be used. As another example, the process can be used for forming a coating of titanium dioxide, of a coating of a mixture of oxides such as a mixture of cobalt, iron and chromium oxides.

This invention also includes apparatus for pyrolytically forming a metal compound coating on hot glass, and there is accordingly provided apparatus for pyrolytically forming a metal compound coating on an upper face of a hot glass substrate in sheet or ribbon form comprising conveyor means for conveying a said substrate along a path in a downstream direction, a roof structure defining a coating chamber opening downwardly onto said path and means for discharging coating precursor material into said chamber, characterised in that upstream of said coating chamber there is an antechamber which communicates with the coating chamber via an entry slot which is defined in part by the path of the substrate, and via which gas can be caused to flow into the coating chamber so as to form (when the apparatus is in use) a blanket layer which covers the upper face of the substrate along a first part of the length of said chamber, and in the means is provided for controllably preheating the gas forming said blanket layer.

Such an apparatus is particularly apt for the formation of high quality coatings of regular thickness in a continuous process, for example a process as hereinbefore defined. The apparatus can be located at any convenient place. Such an apparatus is particularly advantageous in that it allows the control of conditions at the zone where coating formation commences which are otherwise difficult to modify.

Advantageously, exhaust ducting is located with one or more inlets at the downstream end of said coating chamber. Exhaust ducting located there is extremely beneficial for generating aspirating forces to act on the gas at the upstream end of the coating chamber to maintain a general downstream flow of material in the coating chamber while ensuring that there is no dead zone within the chamber where corrosive precursor material or reaction products can accumulate and that the forces exerted on the atmosphere at the upstream end of that chamber will be rather diffuse. It has been found that this tends to reduce any disturbance to the atmospheric currents subsisting in the upstream end of the coating chamber.

In most preferred embodiments of the invention, a curved exhaust scoop extending across at least the major part of the substrate path is provided at the downstream end of said coating chamber, which scoop defines in part at least one exhaust duct inlet. Such an apparatus is of simple construction and it is easy to locate. The use of a curved scoop is particularly valuable in guiding material to be aspirated smoothly into the exhaust duct inlet, and helps to avoid surges of back-pressure there which could disrupt the atmospheric currents in the passageway. It is particularly desirable to use such a scoop which extends across the full width of the coating chamber and which is adjustable in height above the substrate path, for example by means of a pivotal mounting, so as to achieve the maximum closure of the downstream end of the coating station.

In especially preferred embodiments of the invention, a barrier wall is provided above the substrate path extending across the full width of and substantially closing the downstream end of said coating chamber. Such a barrier wall may for example be provided by a said exhaust scoop. This is a very simple way of ensuring that changes in conditions immediately downstream of the end of the coating chamber will have no direct effect on conditions within the coating chamber, and vice versa.

In particularly preferred embodiments of the invention, said coating station is located between the exit from a ribbon-forming plant and the entrance to an annealing lehr. When this is done, it will be found that the glass can reach the coating station at a temperature which is, or is close to, that required for the pyrolytic coating reactions to take place. Accordingly, the adoption of this feature dispenses with the need for further heating apparatus such as would be required to raise the temperature of the glass to be coated from room temperature.

Advantageously, over at least part of the length of the chamber, means is provided for inhibiting flow of atmospheric material past the sides of the substrate path and between zones vertically above and vertically below that path. Such an undesirable flow of atmospheric material could cause irregular deposition of coating material on the upper and/or lower face of the substrate especially at its side margins.

It is especially preferred that the coating precursor material discharge means is arranged to spray liquid coating precursor material downwardly and in the downstream direction. Such is a very simple apparatus for the discharge of relatively large quantities of coating precursor material such as may be required for the formation of rather thick coatings, and it permits such discharge without disrupting a general flow of atmospheric material along the coating chamber in the downstream direction as is beneficial for the formation of high quality coatings.

In such embodiments, it is especially preferred that such spraying means is located to spray said coating precursor solution into a spraying zone of said coating chamber from a height above the substrate path of at least 75 cm; heating means is provided for supplying heat to said spraying zone; said roof structure defines a passageway portion of said coating chamber leading downstream from said spraying zone and imparting to the coating chamber a total length of at least 2 meters; and means is provided for generating aspirating forces on atmospheric material within such passageway to encourage such material to flow along the substrate path to the downstream end of said passageway and to enter exhaust ducting for leading such material away from the substrate path.

Apparatus having these features is especially useful. Such apparatus is more economical to run than conventional vapour coating apparatus in which all coating precursor material must be vaporised before contact with the glass, and it is simpler to construct than known spraying apparatus in particular because the problems associated with splashing and entraining large quantities of sprayed coating precursor solution away from the zone where the coating is formed can easily be avoided by ensuring that the heat delivered is sufficient to evaporate a substantial proportion of the sprayed coating precursor.

When using such an apparatus, we have found it very much easier to form coatings of high optical quality and uniform strucure reliably and reproducibly, even at high coating formation rates, and without inducing high thermal stresses in the glass. In particular, we have found it very much easier to form coating which have a low, and uniformly low, haze factor.

Of course in order to achieve such reproducible high coating quality, the apparatus should be used in a suitable way, but the combination of features of the apparatus as defined above is particularly beneficial for facilitating control of conditions within the coating chamber. In order to achieve these good results, we have found when using the apparatus that it is best to control conditions so that a substantial proportion of the coating precursor solution is evaporated before it penetrates the blanket layer to contact the substrate, so that the blanket layer is not greatly disturbed by the sprayed material and so that the atmosphere within the spraying zone becomes charged with coating precursor vapour which is then aspirated along the passageway where it remains in contact with the substrate.

It has hitherto been thought necessary to discharge the precursor solution from close to the substrate, a spray height of 30 cm or less is usual, in order not to allow the precursor material time to react with the atmosphere within the coating chamber and form reaction products which could deposit on the substrate and form defects on the coating. It has also been thought necessary to aspirate excess coating precursor material and reaction products away from the substrate as soon as possible, again to prevent spurious deposition on the substrate, and coating chamber lengths of 60 cm to 100 cm are typical of those found in the prior art.

The reasons why the use of such apparatus should favour high coating quality standards are not wholly clear, but the fact remains that with the aid of such apparatus we are able to form coatings with a more uniform and lower haze factor than has been possible before. The coatings formed can have a high optical quality, and a regular and predictable thickness. Furthermore, by usig such apparatus, we are able to form these coatings on glass substrates more rapidly, and therefore to greater thicknesses or onto more rapidly moving substrates, than we have hitherto been able.

In fact this represents a radical departure from the teaching of the prior art in the field of pyrolytic coating apparatus, and it forms the subject of the invention described in our said copending British Patent Application filed on this date (Dec. 20, 1985, Application No. 85 31 423), which application describes and claims apparatus for pyrolytically forming a metal compound coating on an upper face of a hot glass substrate in sheet or ribbon form comprising conveyor means for conveying a said substrate in a downstream direction along a path, a coating station comprising a roof structure defining a coating chamber opening downwardly onto said path and means for spraying coating precursor solution into said chamber, downwardly towards the substrate, characterised in that: the spraying means is located to spray said coating precursor solution into a spraying zone of said coating chamber from a height above the substrate path of at least 75 cm; heating means is provided for supplying heat to said spraying zone; said roof structure defines a passageway portion of said coating chamber leading downstream from said spraying zone and imparting to the coating chamber a total length of at least 2 meters; and means is provided for generating aspirating forces on atmospheric material within such passageway to encourage such material to flow along the substrate path to the downstream end of said passageway and to enter exhaust ducting for leading such material away from the substrate path.

In some highly preferred embodiments of the invention, said coating chamber comprises a passageway along which coating precursor vapour and oxidising gas can be conducted downsteam in contact with a said upper substrate face during said conveyance of the substrate, and in which there is means which defines a mixing zone in which coating precursor material and oxidising gas can be brought together, out of contact with the substrate, and mixed to form an atmosphere comprising an intimate mixture of precursor vapour and oxidising gas, said mixing zone being in communication with said passageway to permit a stream of such intimate mixture to flow along said passageway from said mixing zone.

Such an apparatus is particularly apt for the formation of high quality coatings which are substantially free from unpredictable thickness variations, at high coating formation rates and in a continuous process.

Again, this allows reduced disturbance of the blanket layer by the discharged coating precursor material, and a very high quality coating can be formed using this apparatus, presumably because the coating precursor vapours can mix into the blanket layer substantially without disturbing its general flow.

As an example of such embodiments, apparatus according to the present invention may with advantage also incorporate one or more features of apparatus disclosed in in our said copending British Patent Application filed on this date (Dec. 20, 1985, Application No. 84 31 424), which application describes and claims apparatus for use in pyrolytically forming a metal oxide coating on an upper face of a hot glass substrate in sheet or ribbon form, said apparatus comprising conveyor menas for conveying a said substrate in a downstream direction along a path and a roof structure defining a coating chamber opening downwardly onto said path and comprising a passageway along which coating precursor vapour and oxidising gas can be conducted downstream in contact with a said upper substrate face during said conveyance of the substrate, characterised in that there is means which defines a mixing zone in which coating precursor material and oxidising gas can be brought together, out of contact with the substrate, and mixed to form an atmosphere comprising an intimate mixture of precursor vapour and oxidising gas, said mixing zone being in communication with said passageway to permit a stream of such intimate mixture to flow along said passageway from said mixing zone.

It is especially preferred that said roof structure exhibits a marked drop in height above the substrate path in the downstream direction thereby to throttle the downstream flow of vapour from the zone of discharge of coating precursor material into the coating chamber.

The adoption of this feature allows a relatively high upstream discharge zone to give ample room for good mixing of the discharged coating precursor material into the atmosphere within that zone and which can serve as a reservoir of coating material vapours which are then constrained to flow down towards the substrate to mix in with the blanket layer and flow along towards the downstream end of the coating chamber in a concentrated and uniform stream which is beneficial for the formation of coating material from the vapour phase.

Preferably, said gas preheating means is controllable to heat to different extents the gas forming different portions of said blanket layer across the width of the substrate path. This allows a finer control of the temperature of the gas which will go to make up the blanket layer.

Advantageously, said gas preheating means is controllable to heat the gas forming side marginal portions of said blanket layer to a greater extent than the gas forming central portions of said layer. This is beneficial in particular for allowing compensation for the increased cooling of the atmosphere within that coating chamber which takes place adjacent the side wall of that chamber, so as to promote a wider strip of the substrate which is coated to the desired thickness.

In preferred embodiments of the invention, the partition wall above the entry slot comprises a gate for adjusting the opening of the entry slot. This gives a further means of controlling the conditions in the blanket layer of gas flowing in the coating chamber, for example for varying the speed of such gas flow to suit prevailing conditions beneath the zone is discharge of the coating precursor material.

Preferably, such gate is constructed in independently movable sections for adjusting the entry slot opening differentially across the width of the substrate path, so that such control can be effected independently at different locations across the width of the substrate path, for example on detection of thickness variations in the coating formed.

In especially preferred embodiments of the invention, means is provided for heating the atmosphere within said antechamber from above the level of the substrate path. This is a very simple apparatus for directly affecting the temperature of the blanket layer of atmosphere in contact with the upper face of a substrate within the antechamber.

Advantageously, such antechamber heating means comprises burners, since this allows a very efficient heating effect, simple adjustability, and rapid response to any adjustment.

Preferably, means is provided for blowing preheated gas into said antechamber. This enables the gas to be blown into the antechamber without, or with reduced, heat loss to a substrate therein, and it means that an adequate supply of gas for forming the blanket layer can be supplied from a smaller antechamber.

Advantageously, means is provided for blowing preheated gas upwardly into the sides of said antechamber from below the level of the substrate path. This is a very convenient and efficient apparatus for compensating for heat loss through the side walls of the antechamber.

Preferably, means is provided for blowing preheated has into said antechamber in the downstream direction from above the level of the substrate path. This is another convenient way of blowing preheated gas into the antechamber, and it has the additional advantage of promoting a general downstream flow of gas into and through the coating chamber.

In some preferred embodiments of the invention, means is provided for blowing preheated gas downwardly into said antechamber and for restraining such gas from flowing down past the side edges of the substrate path. This is yet another convenient way of blowing preheated gas into the antechamber in order to control the atmosphere immediately above the substrate track.

In some preferred embodiments of the invention, said antechamber has a roof which slopes downwardly towards the top of said entry slot. This promotes a smooth flow of gas into and through the entry slot, for forming the blanket layer in contact with a substrate on the path.

Advantageously, means is provided for projecting a stream of gas into the chamber in the downstream direction to maintain a general downstream flow of atmospheric material over a substantial part of the height of the chamber. Such means helps to maintain the atmospheric pressure within the coating chamber, so reducing the likelihood that any random currents of air will be drawing into that chamber through its walls to disturb the desired pattern of atmospheric currents therein, and such a general downstream flow also helps to hold the blanket layer of atmosphere down onto the substrate.

Preferably, means is provided for discharging at least one auxiliary stream of preheated gas into the coating chamber to flow in the downstream direction in or adjacent said blanket layer, and through the zone at which coating formation commences. An auxiliary gas stream can thereby be generated to reinforce the blanket layer and/or to protect it against any random currents which may subsist within the chamber. Also, the use of such a current allows relatively fine control of the temperature and/or flow rate of the blanket layer as a whole.

This invention will now be described in greater detail with reference to the accompanying diagrammatic drawings of various preferred embodiments of apparatus according to the invention and by way of Examples of specific processes according to the invention performed using such apparatus.

In the drawings, each of FIGS. 1 to 3 is a cross-sectional side view of an embodiment of coating apparatus in accordance with the invention.

Figure 1:
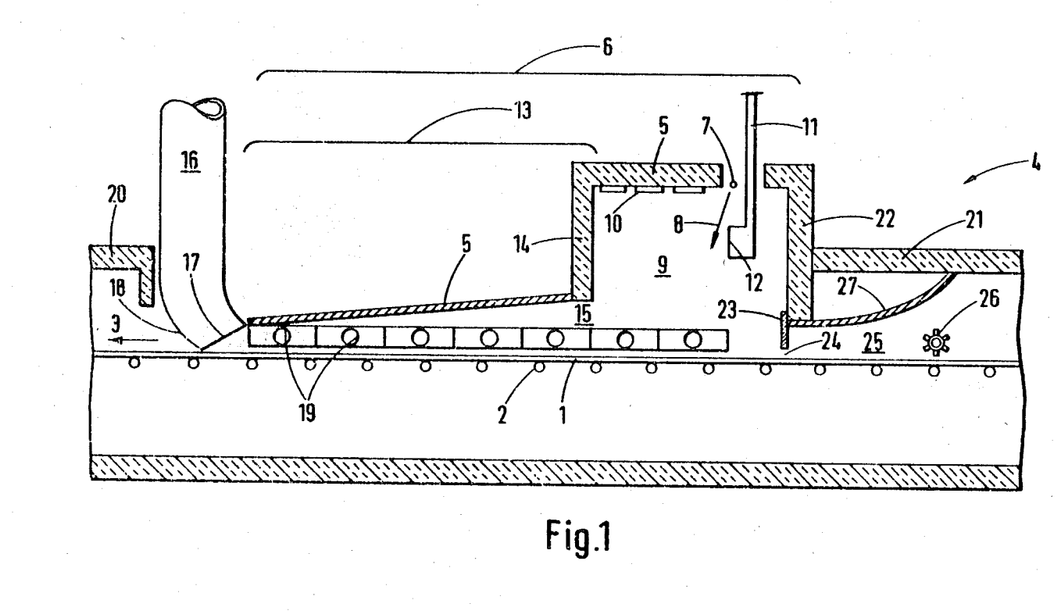

FIG. 1

In FIG. 1, apparatus for pyrolytically forming a metal compound coating on an upper face of a heated glass substrate 1 in sheet or ribbon form comprises conveyor means such as rollers 2 for conveying a substrate in a downsteam direction 3 along a path also indicated by reference number 1. The path 1 leads beneath a coating station 4 comprising a roof structure 5 defining a coating chamber 6 opening downwardly onto the substrate path 1 and a spray nozzle diagrammatically represented at 7 for spraying a stream of coating precursor solution into the chamber 6, in a direction 8 downwardly towards the substrate 1.

The spray nozzle 7 is located to spray the stream of coating precursor solution into a spraying zone 9 of the coating chamber 6. In the embodiment illustrated, the spray nozzle 7 is located to spray coating precursor material e.g. from a height of at least 75 cm above the substrate path 1, and preferably at least 1.2 meters, and it is of a type well known per se. The nozzle is arranged to spray the coating precursor solution in the direction 8 downwardly towards the substrate 1, and in the downstream direction 3, and it is movable to and fro along a track (not shown) across the width of the substrate path.

In the embodiment illustrated, heating means is provided for supplying heat to said spraying zone. Such heating means comprises downwardly directed radiant heaters 10 provided in the roof of the spraying zone 9. Ducting 11 is provided for discharging a stream of preheated gas into the spraying zone 9 in a direction to intersect the sprayed stream 8 of coating precursor material. The ducting 11 has its discharge orifice 12 located in the upper half of the height between the spray nozzle 7 and the substrate 1, and is arranged to discharge that gas stream from upstream of the coating prcursor spray discharge axis. The discharge orifice 12 has a lesser width than the substrate path 1, and it is moved to and from across the spraying zone in tandem with the spray nozzle 7. Gas discharged from orifice 12 is initially directed substantially horizontally, across the transverse path of the droplet stream 7, to maintain a circulation of gas within the spraying zone 9.

The discharged gas is suitably air, preheated for example to a mean temperature in the range 300° C. to 600° C. The heaters 10 cause evaporation of part of the stream of sprayed droplets during their travel towards the substrate 1, and the vapour so formed is entrained in the stream of preheated air discharged from the orifice 12.

The roof structure 5 defines a passageway portion 13 of the coating chamber 6 leading downstream from the spraying zone 9 and imparting to the coating chamber 6 a total length of at least 2 meters, and preferably a length of at least 5 meters. In the embodiment illustrated, the roof structure 5 includes a bridge wall 14 over the substrate path which descends substantially vertically to define an exit slot 15 at the downstream end of the spraying zone separating that zone from the passageway, and the passageway 13 has a height which descends in the downstream direction from a maximum value at the exit slot 15. The height of the exit slot 15 is less than half of the height between the spray nozzle 7 and the substrate 1.

At the downstream end of the passageway 13, atmospheric material is aspirated into exhaust ducting 16 having an inlet 17 defined in part by a curved exhaust scoop 18 which extends above the path of the substrate 1 across the full width of the passageway, and substantially closes its downstream end, so as substantially to prevent the flow of atmospheric material into or out of the coating chamber 6 at the downstream end of the passageway 13. Such scoop 18 may optionally be mounted pivotally so that it can be adjusted for minimum clearance with the substrate 1. Also at the downstream end of the passageway 13, atmospheric material is aspirated into side exhaust ducting 19 located to each side of the coating chamber, in order to encourage a lateral spread of the atmospheric material flowing along the coating chamber. In fact, such side exhaust ducting 19 extends along substantially the whole length of the passageway well into the spraying zone, almost up to its upstream end, to inhibit coating precursor vapours from flowing beneath the substrate path 1.

The coating station 4 is located between the exit from a ribbon forming plate (not shown), for example a float tank, and the entrance to an annealing lehr 20.

A passage from the ribbon forming plate to the coating chamber 6 has a roof 21, and the upstream end of the coating chamber is determined by an end wall 22 from which depends a gate 23, allowing clearance for the substrate 1 to pass into the coating chamber via an entry slot 31.

Upstream of the gate 23 there is an antechamber 25 in which heating means 26 are provided. Such heating means may be radiant heating means, or one or more burners, or it may as shown comprise a finned radiator. A roof member 27 depends from the passage roof 21 and the upstream end wall 22 of the coating chamber, and forms a roof for the antechamber 25 which slopes down towards the entry slot 24 to the coating chamber.

In operation, a semi-natural current of gas will be drawn into the upstream end of the coating chamber 6 from the antechamber 25 so that the gaseous environment in the immediate vicinity of the upper face of the substrate 1 at least in the zone at which coating formation commences, is controlled by preheated gas fed in the downstream direction 3 into the chamber 6 to enter the chamber in contact with the substrate 1 and form a blanket layer which covers the substrate at least as far as the zone of contact with the coating precursor material.

The effect of the end wall 22 and gate 23 is to control the height of the current of atmospheric material flowing into the coating chamber 6 from the upstream direction and forming the blanket layer convering the ribbon, so that atmospheric conditions within the region where coating formation commences can more easily be controlled.

EXAMPLE 1

In a specific practical embodiment of the apparatus shown in FIG. 1, the coating chamber 6 is a little over 3 meters wide to accommodate glass ribbons having a width of up to about 3 meters. The roof structure 5 above the spraying zone 9 of the coating chamber is just over 1 meter above the level of the ribbon path 1, and the spraying orifice of the droplet discharge nozzle 7 is close to the lever of that roof. That nozzle 7 is arranged to discharge a conical stream of droplets in a direction 8 at an angle of 45° to the horizontal. The bridge wall 14 at the downstream end of the spraying zone 9 is separated from the coating chamber upstream end wall 22 by a distance of 2.2 meters. The passageway 13 has a height which reduced from 40 cm at the exit slot 15 to 25 cm at its downstream end. The length of that passageway is 4.5 meters.

This apparatus is particularly designed for the formation of tin oxide coatings starting from a solution of stannous chloride as coating precursor material.

Using such apparatus, a tin oxide coating 750 mm in thickness was formed on a 6 mm thick ribbon of float glass travelling at a speed of 8.5 mm/min. The glass entered the coating chamber at a temperature of 600° C., and the coating precursor used was an aqueous solution of stannous chloride containing ammonium bifluoride for the provision of doping ions in the coating. This solution was sprayed from the nozzle at a rate of 220 L/h while the nozzle was reciprocated across the ribbon path.

Radiant heaters in the roof of the spraying zone were switched on and air was discharged through the orifice 12 at a rate of 6000 $Nm^3/h$ n and a temperature of 400°

C. As a result, part of the sprayed stream of coating precursor material was evaporated leaving part only to continue for positive impact against the glass. The thus formed coating precursor vapour was entrained in the stream of preheated air discharged from the orifice 12, to flow through the exit slot 15 and along the passageway 13 to the exhaust ducting. This Example thus also makes use of the invention described in our copending British Patent Application filed on this date (Dec. 20, 1985, Application No. 85 31 423)

Aspirating forces were generated in exhaust ducting 16, 19 to remove about 100,000 m³/h of atmospheric material from the coating chamber at a mean temperature of about 350° C., thus drawing in a blanket layer of gas preheated by heater 26 and covering the substrate. Such preheating was effected by heating a finned radiator to red heat.

Additionally, the side aspirators 19 tended to draw in atmospheric material from beneath the level of the ribbon, thus inhibiting interchange of atmospheric material between zones vertically above and vertically below the ribbon path.

It was found that this gave an exceptionally fine control of the atmosphere immediately above the substrate in the region where the coating started to form. This was found to be particularly beneficial in giving a regular coating of the required thickness and in that it increased the width of the ribbon over which the coating was formed to that required thickness.

In the result, the coating formed had a fine crystal structuee at the glass/coating interface which promoted a high quality uniform coating structure and hence good optical qualities, and the inclusion of coating reaction products which would lead to defects tended to be avoided.

Figure 2:
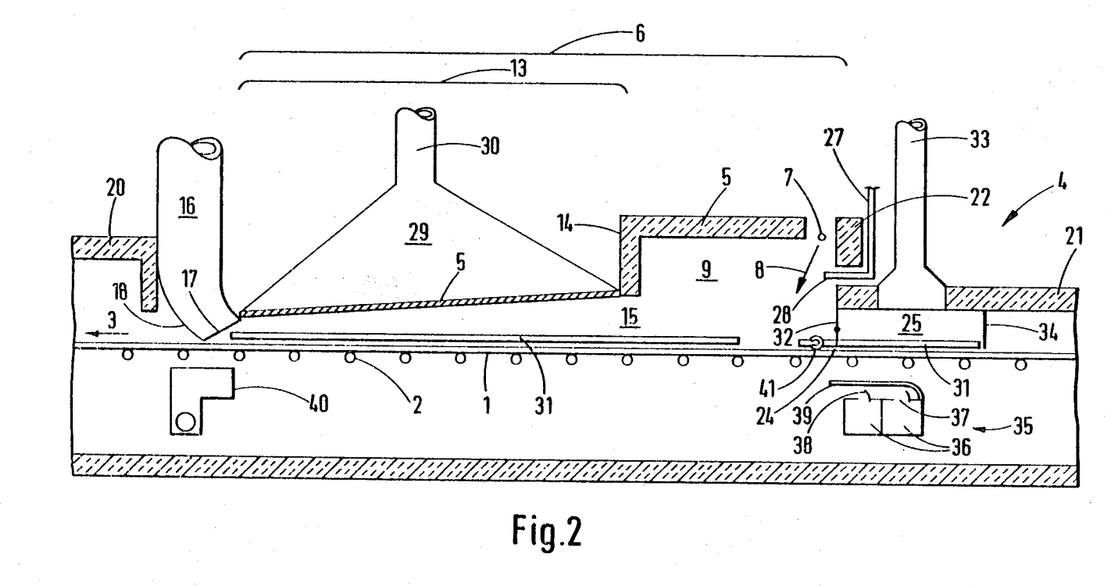

FIG. 2

In FIG. 2, integers serving analogous functions to those illustrated in FIG. 1 have been allotted corresponding reference numerals.

In the spraying zone 9 at the upstream end of the coating chamber 6, the heaters 10 and gas discharge ducting 11 are absent. A gas discharge duct 27 having a discharge slot 28 extending over the full width of the coating chamber is provided for the discharge of additional coating precursor material in the vapour phase to become entrained in the stream of droplets.

Downstream of the exit slot 15 beneath the bridge wall 14, the roof structure 5 continues to define a passageway portion 13 of the coating chamber 6 which again is of reducing height.

The roof 5 of the passageway 13 is of porous construction and is surmounted by a plenum chamber 29 which can be filled with preheated air via ducting 30, so as to introduce such heated air through the roof of the passageway 13 and form a barrier layer against corrosion of the roof there and against condensation of coating precursor vapours on the roof.

Along the length of that passageway 13, baffles 31 are provided at each side of the coating chamber projecting inwardly from the side walls of the coating chamber and over the margins of the substrate 1. These baffles extend over the full length of the substrate path occupied by the passageway, and indeed such baffles extend all the way to the upstream end of the antechamber 25 being interrupted only at the region where they would intercept the sprayed stream 8 of coating precursor material.

Beneath the upstream end wall 22 of the coating chamber 6, the vertical gate 23 shown in FIG. 1 is replaced by a pivotable gate 32 allowing a variable entry slot 31 so that the rate at which atmospheric material can be drawn into the coating chamber from the antechamber 33 to form a blanket layer covering the glass can be controlled more easily. Additionally, gas discharge ducting 33 is provided for discharging preheated gas downwardly into the antechamber for forming the layer of atmospheric material immediately above the substrate 1 up to at least the zone where the stream of coating material impinges against the glass. The upstream end of the antechamber is substantially closed by a barrier wall 34.

Means 35 is provided for discharging gas into the environment of the substrate 1 so as to form a continuous current flowing in the downstream direction 3 beneath each margin of the substrate path 1 and along at least part of the path length occupied by the coating chamber 6.

The below ribbon gas discharge means 35 comprises four plenum chambers 36 located two by two and extending across substantially the full width of the coating station 4. In the top of each plenum chamber 36 is formed a slot 37 bordered by a deflector lip 38 so that gas injected through the slots 37 is directed in the downstream direction 3 along the coating station 4. The slots 37 extend the full length of each plenum chamber 36 across the coating station 4. If desired such slots could be replaced by a plurality of spaced orifices. As shown in FIG. 2, a deflector plate 39 is located above the plenum chambers 36 so that the injected gas is not discharged directly against the substrate 1. The plenum chambers 36 may be fed with preheated gas from both sides of the coating station 4, for example from heat exchangers. Air may be used as the discharged gas and this may readily be heated by heat exchange with furnace flue gases. Such gas is preferably preheated to within 50° C. of the temperature of the substrate as the latter enters the coating chamber 6.

Gas discharged beneath the substrate 1 may be removed from the environment of the substrate 1 through optional exhaust ducting 40, and this may be located with its inlet extending transversely under the substrate path for example located in register with the above path exhaust inlet 17.

Close to the upstream end of the coating chamber, just above the level of the substrate, there is provided an auxiliary gas discharge conduit 41 for discharging preheated gas into the chamber adjacent the substrate to flow in the downstream direction, to reinforce the blanket layer feeding into the coating chamber past the gate 32 further to condition the atmosphere in contact with the substrate where it is first contacted by the coating precursor material.

EXAMPLE 2

The apparatus of FIG. 2 was used to form a tin oxide coating of the same thickness as in Example 1 on a ribbon of glass of the same thickness and moving at the same speed. The coating precursor material used was stannic chloride dissolved in dimethylformamide. and this was discharged from a spray nozzle 7 located 75 cm above the ribbon and inclined to the horizontal by 30°. Stannic chloride vapour was discharged from the slot 28. The vapours formed in the spraying zone 9 were aspirated along the passageway 13 by frontal aspiration through the exhaust ducting 16 only, and at a rate to give a coating of the desired thickness.

The glass entered the coating chamber 6 at a temperature of 600° C., and air preheated to 600° C. was discharged at a rate of 3000 Nm³/h into the antechamber 25 from the ducting 33, to flow into the coating chamber as a blanket layer cover the glass.

Atmospheric material within the spraying zone 9 became intimately mixed and a continuous flow of vapour laden atmosphere was driven along the passageway 13 in contact with the face of the substrate on which the coating was being formed.

Air preheated to 550° C. was discharged at a rate of 3000 Nm³/h from the below substrate path discharge means 35.

This also gave excellent results in terms of the width of the uniformly high quality coating formed.

Figure 3:
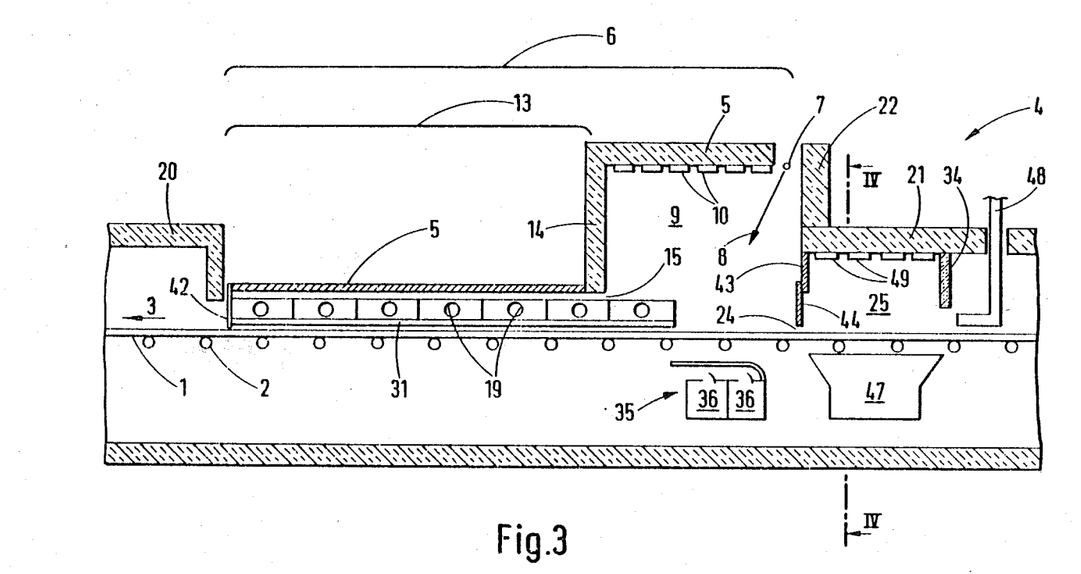
Figure 4:
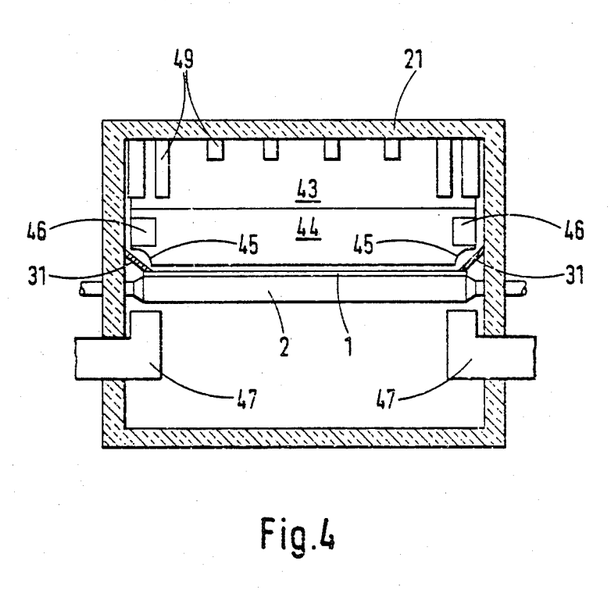
FIG. 4 is a section along the line IV—IV of FIG. 3.

FIGS. 3 & 4

In FIGS. 3 and 4, integers serving analogous functions to those shown in FIGS. 1 and 2 have again been allotted corresponding reference numerals.

In the embodiment of FIGS. 3 and 4, the roof structure 5 over the passageway 13 is horizontal, so that passageway has a uniform height, the height of the exit slot 15, throughout its length.

At the downstream end of the passageway 13, exhaust ducting 16 is absent, and the downstream end of the passageway is substantially closed by a barrier wall 42 instead of the exhaust scoop 18.

The antechamber 25 is separated from the coating chamber 6 by a screening wall 43 depending from its roof 21, and the screening wall 43 in turn supports a vertically movable gate 44 which may be made up in a plurality of sections across the width of the coating chamber 6 to allow differential opening of the entry slot 24. As shown in FIG. 4, the lower corners of the gate 44 are cut away as at 45 in order to allow an increased volume flow rate of gas into the sides of the coating chamber, and shutters 46 are provided for adjusting the opening at those lower corners.

Blowers 47 are arranged below the antechamber 25 for blowing preheated air upwardly past the margins of the path of the substrate 1, and a further blower 48 is arranged to blow preheated air into the antechamber 45 from upstream, between its upstream screening wall 34 and the substrate 1.

Heaters 49 for example burners are provided in the antechamber, and as shown in FIG. 4, these heaters are arranged to deliver more heat at the sides of the antechamber than at its centre.

EXAMPLE 3

The apparatus of FIGS. 3 and 4 was used to form a 400 nm coating of fluorine doped tin oxide on a ribbon of 5 mm float glass travelling at 8.5 m/min to enter the coating chamber at a temperature of 600° C.

The coating precursor used was a solution of tin chloride containing ammonium bifluoride for the provision of doping ions in the coating. This solution was sprayed from the nozzle at a rate of 120 L/h under a pressure of 23 bar while the nozzle was reciprocated at a rate of 23 cycles per minute.

Air preheated to 600° C. was discharged into the antechamber 25 from blowers 47 and 48 and then drawn into the coating chamber to form a blanket layer covering the glass. Aspiration above the level of the substrate was at a rate of 60,000 m³/h at about 350° C. to maintain a general downstream flow of material within the coating chamber.

Radiant roof heaters 10 were switched on to evaporate the sprayed coating precursor material during its travel towards the substrate. Because of the turbulence caused by the reciprocating movement of the spray nozzle and the sprayed stream of coating precursor material, the evaporated material became intimately mixed with air in the spraying zone 9, and this vapour laden atmosphere was drawn down into the exit slot 15 and along the passageway 13. The coating precursor vapour mixed with the blanket layer of atmosphere in contact with the glass, and a coating of the required thickness was deposited. Thus this Example also makes use of the invention described in our copending British Patent Application filed on this date (20 Dec. 1985, Application No. 85 31 424).

Air preheated to 550° C. was discharged at a rate of 3000 Nm³/h from the below substrate path discharge means 35.

The antechamber 25 included burners 49 for preheating the atmosphere therein. These burners permit the air to be heated according to any desired temperature profile, for example to a greater extent at the sides of the antechamber.

The coating formed by the process of this Example was of extremely high quality and uniformity over substantially the whole width of the ribbon.

EXAMPLES 4 to 6

In a variant of each of the foregoing Examples, the apparatus is used to form a coating onto glass which has been cut into sheets and then reheated, the process being otherwise similar.

Similar results in terms of coating quality are achieved.

We claim:

1. A pyrolytic coating process in which a hot glass substrate in sheet or ribbon form travels in a downstream direction beneath a coating chamber which opens downwardly towards the substrate and in which a coating is formed on the upper face of said substrate from coating precursor material, characterised in that the temperature of the gaseous environment in the immediate vicinity of the upper face of the substrate at least in the zone at which such coating formation commences, is controlled by feeding preheated gas in a downstream direction into said chamber to enter the chamber in contact with the substrate and form a blanket layer which covers the substrate at least as far as that zone, the coating chamber is substantially closed at its downstream end to prevent interchange of atmospheric material between the downstream end of the coating chamber and a further downstream region of the substrate path, and, over at least part of the length of the coating chamber, flow of atmospheric material past the side edges of the substrate and between zones vertically above and vertically below the substrate is inhibited.

2. A process according to claim 1, wherein a general downstream flow of gas along the coating chamber is at least in part maintained by aspirating atmospheric material from that chamber at its downstream end.

3. A process according to claim 1, wherein the glass substrate is a freshly formed ribbon of hot glass and the coating is formed after that ribbon leaves a ribbon-forming plant, and before its entrance to an annealing lehr.

4. A process according to claim 1, wherein a coating precursor solution is sprayed downwardly and in the downstream direction.

5. A process according to claim 1, wherein a coating precursor solution is sprayed downwardly into said coating chamber and through said blanket layer.

6. A process according to claim 5, wherein a spraying zone of said coating chamber is heated to cause evaporation of part of the coating precursor material before it reaches the substrate to charge the atmosphere in such zone with vaporised coating precursor solution; the solution is sprayed with sufficient energy to ensure positive impact of residual sprayed coating precursor material against the substrate to initiate coating of said substrate face; and atmosphere laden with coating precursor material in the vapour phase is caused to flow in the downstream direction from said spraying zone along and in contact with the coated substrate face for a contact time of at least 10 seconds, whereafter residual material of said precursor laden current is directed away from the substrate.

7. A process according to claim 1 for forming a metal oxide coating, wherein coating precursor material and oxidising gas are continuously fed into a mixing zone in which said precursor material and oxidising gas are brought together out of contact with the substrate and in which they are subjected to mixing forces so as to create an atmosphere comprising an intimate mixture of precursor vapour and oxidising gas, and a stream of such mixture is caused to flow continuously from said mixing zone into and along a passageway to which said substrate face is exposed.

8. A process according to claim 1, wherein the gas forming said blanket layer has been preheated to a greater extent than it could be by heat transfer from the substrate alone.

9. A process according to claim 1, wherein the gas forming side marginal portions of said blanket layer has been preheated to a greater extent than it is at the centre.

10. A process according to claim 1, wherein at least over the side margins of the substrate, the gas in said blanket layer is heated to a temperature greater than that of underlying marginal portions of the substrate.

11. A process according to claim 1, wherein the gas for forming said blanket layer enters the upstream end of the coating chamber from an adjacent antechamber.

12. A process according to claim 11, wherein the gas preheating is effected at least in part in said antechamber and from above the level of the substrate.

13. A process according to claim 12, wherein gas preheating in said antechamber is effected by burners.

14. A process according to claim 11, wherein preheated gas is blown upwardly into the sides of said antechamber from below the level of the substrate.

15. A process according to claim 11, wherein preheated gas is blown into said antechamber in the downstream direction from above the level of the substrate.

16. A process according to claim 11, wherein preheated gas is blown downwardly into said antechamber and such gas is restrained from flowing down past the side edges of the substrate.

17. A process according to claim 1, wherein the volume flow rate of gas forming said blanket layer is controlled differentially across the width of the substrate.

18. A process according to claim 1, wherein over a substantial part of the height of the chamber, atmospheric material is maintained in a general downstream flow in part by projecting a stream of gas into the chamber in the downstream direction.

19. A process according to claim 1, wherein at least one auxiliary stream of preheated gas is introduced into the coating chamber to flow in the downstream direction in or adjacent said blanket layer, and through the zone at which said coating formation commences.

20. Apparatus for pyrolytically forming a metal compound coating on an upper face of a hot glass substrate in sheet or ribbon form comprising conveyor means for conveying a said substrate along a path in a downstream direction, a roof structure defining a coating chamber opening downwardly onto said path and means for discharging coating precursor material into said chamber, characterised in that upstream of said coating chamber there is an antechamber which communicates with the coating chamber via an entry slot which is defined in part by the path of the substrate, and via which gas can be caused to flow into the coating chamber so as to form (when the apparatus is in use) a blanket layer having a controlled temperature which covers the upper face of the substrate along a first part of the length of said chamber, and in that means is provided for controllably preheating the gas forming said blanket layer, a barrier wall is provided above the substrate path extending across the full width of and substantially closing the downstream end of said coating chamber, and, over at least part of the length of the chamber, means is provided for inhibiting flow of atmospheric material past the sides of the substrate path and between zones vertically above and vertically below that path.

21. Apparatus according to claim 20, wherein exhaust ducting is located with one or more inlets at the downstream end of said coating chamber.

22. Apparatus according to claim 20, wherein said coating station is located between the exit from a ribbon-forming plant and the entrance to an annealing lehr.

23. Apparatus according to claim 20, wherein the coating precursor material discharge means is arranged to spray a coating precursor solution downwardly and in the downstream direction.

24. Apparatus according to claim 23, wherein such spraying means is located to spray said coating precursor solution into a spraying zone of said coating chamber from a height above the substrate path of at least 75 cm; heating means is provided for supplying heat to said spraying zone; said roof structure defines a passageway portion of said coating chamber leading downstream from said spraying zone and imparting to the coating chamber a total length of at least 2 meters; and means is provided for generating aspirating forces on atmospheric material within such passageway to encourage such material to flow along the substrate path to the downstream end of said passageway and to enter exhaust ducting for leading such material away from the substrate path.

25. Apparatus according to claim 20, wherein said coating chamber comprises a passageway along which coating precursor vapour and oxidising gas can be conducted downstream in contact with a said upper substrate face during said conveyance of the substrate, and in which there is means which defines a mixing zone in which coating precursor material and oxidising gas can be brought together, out of contact with the substrate, and mixed to form an atmosphere comprising an intimate mixture of precursor vapour and oxidising gas, said mixing zone being in communication with said passageway to permit a stream of such intimate mixture to flow along said passageway from said mixing zone.

26. Apparatus according to claim 20, wherein said roof structure exhibits a marked drop in height above the substrate path in the downstream direction thereby to throttle the downstream flow of atmospheric material from the zone of discharge of coating precursor material into the coating chamber.

27. Apparatus according to claim 20, wherein said gas preheating means is controllable to heat to different extents the gas forming different portions of said blanket layer across the width of the substrate path.

28. Apparatus according to claim 27, wherein said gas preheating means is controllable to heat the gas forming side marginal portions of said blanket layer to a greater extent than the gas forming central portions of said layer.

29. Apparatus according to claim 20, wherein the partition wall above the entry slot comprises a gate for adjusting the opening of the entry slot.

30. Apparatus according to claim 29, wherein such gate is constructed in independently movable sections for adjusting the entry slot opening differentially across the width of the substrate path.

31. Apparatus according to claim 20, wherein means is provided for heating the atmosphere within said antechamber from above the level of the substrate path.

32. Apparatus according to claim 31, wherein such antechamber heating means comprises burners.

33. Apparatus according to claim 20, wherein means is provided for blowing preheated gas upwardly into the sides of said antechamber from below the level of the substrate path.

34. Apparatus according to claim 20, wherein means is provided for blowing preheated gas into said antechamber in the downstream direction from above the level of the substrate path.

35. Apparatus according to claim 20, wherein means is provided for blowing preheated gas downwardly into said antechamber and for restraining such gas from flowing down past the side edges of the substrate path.

36. Apparatus according to claim 20, wherein said antechamber has a roof which slopes downwardly towards the top of said entry slot.

37. Apparatus according to claim 20, wherein means is provided for projecting a stream of gas into the chamber in the downstream direction to maintain a general downstream flow of atmospheric material over a substantial part of the height of the chamber.

38. Apparatus according to claim 20, wherein means is provided for discharging at least one auxiliary stream of preheated gas into the coating chamber to flow in the downstream direction in or adjacent said blanket layer, and through the zone at which coating formation commences.

* * * * *